United States Patent [19]

Benveniste

[11] 4,419,584
[45] Dec. 6, 1983

[54] TREATING WORKPIECE WITH BEAMS

[75] Inventor: Victor M. Benveniste, Magnolia, Mass.

[73] Assignee: Eaton Semi-Conductor Implantation Corporation, Beverly, Mass.

[21] Appl. No.: 283,507

[22] Filed: Jul. 14, 1981

[51] Int. Cl.³ ............................................. H01J 37/20
[52] U.S. Cl. .............................. 250/492.2; 250/443.1
[58] Field of Search ............. 250/443.1, 492.2, 442.1, 250/233; 374/126, 129; 250/443.1, 492.2

[56] References Cited

U.S. PATENT DOCUMENTS

| | | | |
|---|---|---|---|
| 3,470,374 | 9/1969 | Jones | 374/129 |
| 4,144,758 | 3/1979 | Roney | 374/126 |
| 4,186,305 | 1/1980 | Taoka et al. | 250/443.1 |
| 4,186,672 | 2/1980 | Burton | 250/233 |
| 4,228,358 | 10/1980 | Ryding | 250/492.2 |

Primary Examiner—Alfred E. Smith
Assistant Examiner—Jack I. Berman

[57] ABSTRACT

Apparatus for treating workpieces by directing a beam at the workpieces, with resultant heating of the workpieces, the apparatus including a moving support element for carrying the workpieces past a source of the beam in both a scanning direction and in a control direction generally orthogonal to the scanning direction, an infrared detector mounted to move in the control direction but not in the scanning direction to receive black body radiation from the workpieces as they pass under the detector, and means to correct black body radiation measurements of said workpieces for noise resulting from dark current variation, whereby an indication of the temperature of the individual workpieces can be obtained as workpiece movements and beam treatment occur.

17 Claims, 10 Drawing Figures

TREATING WORKPIECE WITH BEAMS

BACKGROUND OF THE INVENTION

In the implantation of ions upon a semiconductor substrate, the impinging ions heat the substrate, and this can detrimentally affect the substrate, requiring that it be rejected. For instance, photoresistance materials are often deposited upon a substrate prior to implantation to define a pattern in which the ions are to be implanted. If heated to too high a temperature, such photoresistance materials will be destroyed, and implantation will thereafter occur on unwanted areas of the substrate. Also, above a certain temperature, undesirable diffusion effects can occur in a semiconductor substrate. In each of these instances the substrate may be ruined, but its ruined condition may not be detected, and the defective substrate may be subjected to many more expensive treatment steps, before its defective condition is detected.

While it has long been recognized that the temperature of the substrate is a critical factor in ion implantion, no adequate means for monitoring that temperature, or the temperature-dependent damaged state of the substrate, have been known. One of the difficulties is that during the implantation process the substrate is typically placed on a moving carrier, for instance a rapidly spinning disk, contained in a high vacuum. These circumstances have generally prevented the use of direct contacting devices for monitoring the temperature.

SUMMARY OF THE INVENTION

The invention employs an ion implanter of known kind employing a stationary beam source and a means for passing wafers under the beam source in both a scanning direction, and in a control direction generally orthogonal to the scanning direction. According to the invention, an infrared (IR) detector is mounted in a predetermined position to move with the wafers in the control direction but not in the scanning direction to monitor a region of each wafer as it passes under the detector, and the monitoring system is adapted to observe the temperature of this region. The system is associated with a discriminating means enabling correlation of each pulse of the detected IR radiation with the particular wafer that produces the pulse. In this way it is determined which wafer has received damage, enabling rejection of the wafer or troubleshooting of the particular wafer position for instance for correction of a cooling deficiency for that wafer position on the carrier.

In another aspect of the invention, correction for dark current variation is achieved without the use of a chopper, by employing an opening in the support element which carries the wafers. Behind this opening is positioned a reference source. The opening passes by the detector once each revolution, and at that point the detector detects the reference and establishes the base line from which the instrument determines the temperature reading.

In a preferred embodiment, the apparatus is an ion implanter, an array of wafers is carried on a spinning carrier disk, and a slot is provided on that disk exposing a portion of the housing which is at room temperature and serves as the reference. The slot may be the same slot in the carrier disk which in the ion implantation position serves mommentarily to admit the ion beam to a beam intensity detector, in a manner already known.

The dark current reference is preferably of the same substance as the substance of the wafers being implanted. This provides for the same emissivity of the surfaces and allows correction for that parameter. For this purpose the housing of the system preferably has a reference station adapted to removably receive a reference wafer or the like, in alignment through the carrier, with the IR detector.

In the preferred embodiment of the invention, a spinning disk carrier is employed, mounted for rotation within a housing, and means are provided for translating the housing in the control direction past a beam source. The IR detector is mounted in the wall of the housing, to translate therewith, and is aligned with the center region of a circular array of wafers on the disk. The disk has a radial slot, and on the opposite wall of the housing is provided the reference surface for dark current correction. Means are provided for detecting the rotary position of the disk, and the signal therefrom is employed to correlate each pulse detected by the IR detector with a position on the disk.

In one method of use, a monitoring means is employed to monitor the sequence of IR pulse detected by the IR detector around the disk during the sequence of revolutions that occur during the gradual traversing motion of the disk of wafers under the beam. As a traversing cycle proceeds, the IR detector detects peak amplitudes that gradually vary depending upon the relative location of the beam on the array of circular wafers. Peak values occur when the implanting beam is aligned with the center of the circular wafers. The operator observes these peak values, and when any such peak value exceeds a predetermined limit, the location of such peak value is determined for purposes of rejecting the corresponding wafer and for troubleshooting.

In a preferred system of automatic control employing the invention, the temperature as determined from the IR radiation of the hottest wafer is compared with a temperature limit, and a comparison circuit is employed to control beam intensity to prevent the temperature of the hottest wafer from exceeding the limit value.

The invention also provides a suitable IR circuit which provides an output signal approximately linear with temperature. There is a problem in providing a linear signal, because the peak wavelength of the radiation varies as the wafer increases in temperature during the ion implantation cycle, and because a suitable IR detector, for instance lead selenide, has a response that varies with varying wavelengths. Suitable operability is achieved by a linearizing circuit employing the logarithmic value of the temperature as the detected signal in accordance with the formula $$V_{out} = K \log \times \frac{(W - W_{off})}{W_{ref}},$$

where $V_{out}$ is a voltage that is proportional to the absolute temperature, K is the proportionality factor, x is a suitably chosen base for the logarithm, W is proportional to detected power, and $W_{off}$ is a correction factor used to correct for dark current variation and fit the real response curve (which is not truly logarithmic throughout the range of operation).

PREFERRED EMBODIMENT

The structure and operation of a preferred embodiment of the invention will now be described, after first briefly describing the drawings.

Drawings

Referring to FIGS. 1 through 4, there is shown apparatus 100 for implanting silicon wafers $W_S$, the workpieces, mounted on the surface of spinning disk 104, a moving support element, with ions via beam 102. The disk is approximately 25 inches in diameter and ¾ inch thick, and is contained in vacuum chamber 106, which is defined by chamber cover wall 109 and facing walls 113, 126. Chamber 106 is approximately 25½ inches in diameter and 1 and ½ inches thick, which is only slightly larger than the disk so as to minimize evacuated volume. Thirteen 4" wafers are mounted on the disk in a single annular layer. The disk is supported on spindle 110, which passes through wall 109 into vacuum chamber 106. Chamber cover wall 109, to which the disk 104, spindle 110, and drive motor 112 are attached, is pivotally supported on hinges 150.

Figure 2:
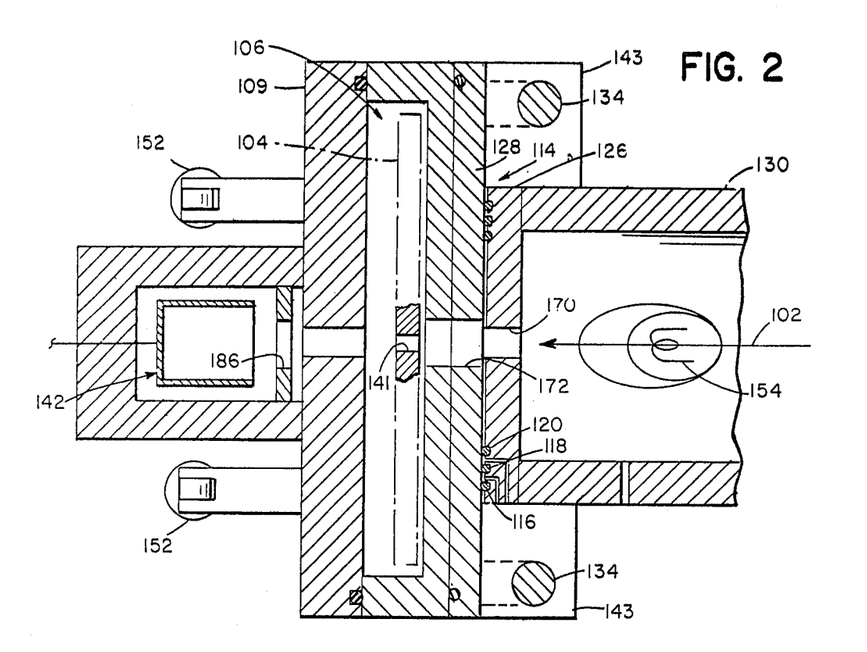
FIG. 2 is a horizontal sectional view, taken at 2—2 of FIG. 1.
Figure 3:
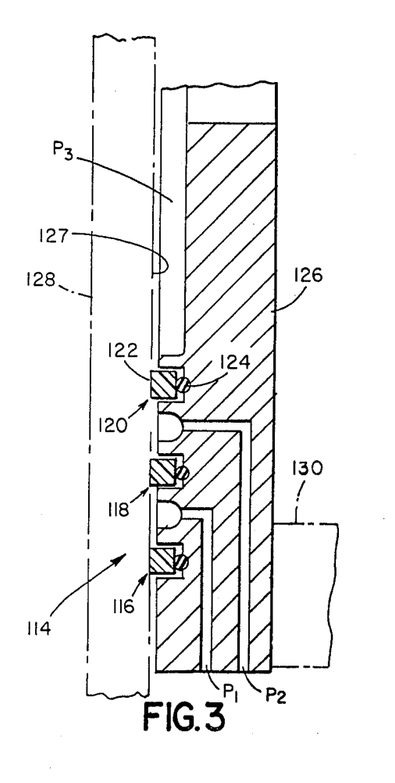
FIG. 3 is an enlargement of a portion of FIG. 2 showing vacuum seals.
Figure 4:
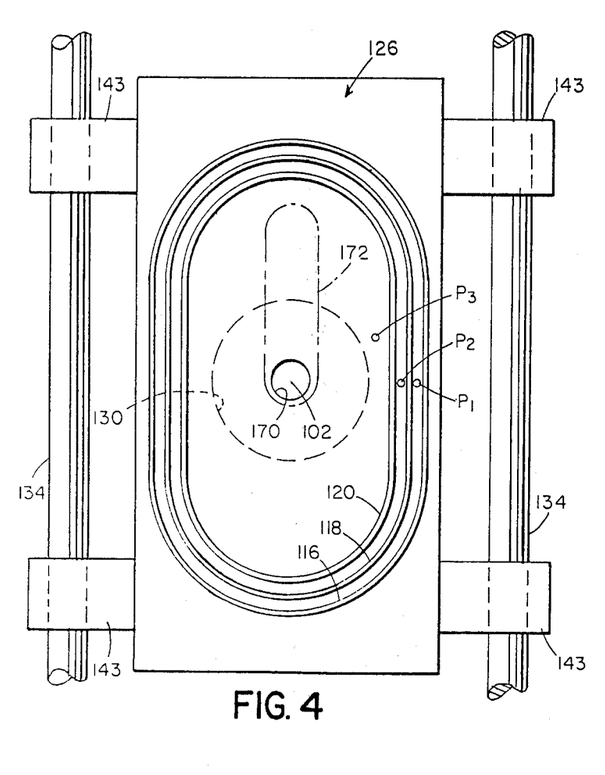
FIG. 4 is a sectional view at 4—4 of FIG. 1 showing the seal plate.

In order to effect a high vacuum seal around spindle 110, well-known ferrofluidic seals 121 are used. The disk is rotated by DC servo-system 112 at a scanning speed of 800 rpm ±4 rpm. A second axis of motion enables the entire vacuum chamber assembly to be translated laterally in a control direction so as to move disk 104 radially with respect to stationry beam 102. A sliding high-vacuum seal 114 permits this lateral motion in the control direction while maintaining the vacuum. (The two directions of motion for disk 104 are shown on FIG. 5.) The seal consists of fixed concentric sealing rings 116, 118, 120 mounted in fixed plate 126 bearing against moving slide plate 128 (FIGS. 2 and 3). The seals each have a high-wear-resistant ring 122 (high-density and high-molecular-weight polyethylene) backed by an O-ring 124 of soft Buna (low durometer), which provides the necessary sealing forces. Three successive seals are provided so that the individual seals do not need to undergo full atmospheric to high vacuum differential pressure.

O-ring 124 has a durometer value of 40, which is softer than conventional 60 durometer value O-rings. The cross-sectional diameter of the uncompressed O-ring is 0.275 inches. The O-ring is compressed between 0.005 to 0.010 inch in use, and this is considerably less than the compression conventionally used in an O-ring seal, i.e., 20 to 30 percent, or about 0.070 inch for this size O-ring. The softer O-ring and smaller compression result in a very low compression force on polyethylene sealing ring 122. Slide plate 128 has a flatness and parallelism tolerance of 0.005 inch or less. This amount of variation can be accommodated by the resilience of the O-ring without significant leakage occurring. Also, a small amount of leakage is permissible because of the between-seal pumping arrangement. Sealing rings 122 are designed to have sufficient flexibility to conform to the variations in plate 128. The rings are about ¼ inch wide and ⅛ inch thick. The grooves containing rings 122 and O-rings 124 are about 0.010 inch wider than rings 122 to assure that rings 122 have freedom of movement to bend when conforming to undulations in the surface of the slide plate. Slide plate 128 has about a 16 microinch finish.

By use of the concentric planar seals and between-seal pumping, adequate sealing across each seal can be achieved while also using relatively low compression forces on the seal, thereby reducing frictional resistance to lateral motion and improving wear and vacuum reliability. In order to further reduce friction, surface 127 of slide plate 128, against which seals 122 slide, is hardened and polished (hard anodized coat of aluminum infused with DuPont's Teflon (polytetrafluoroethylene) by the Nituff process of Nimet Industries). The Teflon in the Nituff surface is believed to fill the pores, and thereby provide a lubrication effect. The anodizing of surface 127, provides the desired hardness. The between-seal pumping is provided by conventional rotary vane, two-stage vacuum pumps having oil lubrication. Pressure $P_1$ (FIG. 3) in the region between seals 116 and 118 is typically 1 torr. Pressure $P_2$ in the region between seal 118 and 120 is typically $5 \times 10^{-2}$ torr. Pressure $P_3$ in the chamber is typically $1 \times 10^{-6}$ torr.

The vacuum chamber assembly is supported by a linear bearing system and a linear drive system, which provide the desired lateral motion of chamber 106 in the control direction. The linear bearing system includes two stationary Thompson linear bearings 143 through which slide circular shafts 134, attached to slide plate 128. The chamber is moved laterally by stepping motor 140, which drives lead screw 138, threaded in nut 136, attached to plate 128. The strength of beam current 102 striking disk 104, from which electrons are suppressed by electron deflection means 186, is measured by a beam intensity monitor 142 positioned on the other side off disk 104 from aperture 170. A slot 141 is provided in the disk at a suitable location between the wafers from near the outer edge of the disk to the innermost radial position at which the beam strikes the disk. As the disk spins, a sample of the beam passes through the disk once every revolution, and strikes the calorimeter 142. The samples of beam current measured during each disk revolution are fed to translation control circuit 144, which controls motor 140. The control system moves the spinning disk through the stationary beam at a speed proportional to the detected beam current and inversely proportional to the desired ion dosage.

Disk 104 is constructed of aluminum to provide good thermal conductivity and avoid contamination of the semiconductor wafers. Aluminum also has a reasonably good heat capacity, to remove heat from wafers $W_S$, and provides adequate rigidity for the high-speed rotating disk. Infrared (IR) detector 200 is provided in wall 113 at a position radially opposite from ion beam slot 172 (FIGS. 1 and 5) to monitor the increase in temperature of wafers resulting from ion implantation. Detector 200, available from Opto Electronics, under the trade designation OTC-12-83T, measures black body radiation with wavelengths between 5 and 10 microns. Portion 202 of detector 200 is mounted in wall 113, is approximately ½ inch in diameter and ½ inch long and includes a 3 by 3 mm square lead selenide sensitive portion 204 facing apperature 206 is cover plate 208, mounted with its surface 210 flush with that of wall 113. Detector 200 is maintained at −30° C. by a thermoelectric control system, described in detail later. Reference wafer 212 is mounted on surface 214 in relieved region 216 of wall 109. The faces of reference wafer 212, wafer $W_S$ in front of it (and the portion of disk 104 on which it is mounted), plate 208, and sensitive portion 204 are all mounted parallel to each other in planes making an acute 80° angle with the longitudinal axis of spindles 110, about which disk 104 and wafers $W_S$ rotate. Thus detector 200 is mounted on an axis which is perpendicular to wafer workpieces $W_S$.

Cooling water inlet and outlet passages (not shown) are provided within rotating shaft 110, and serve to remove heat from the hub of disk 104. Water passages can also be provided within the body of disk 104.

Heat transfer from the wafer to the disk must not be impeded in order for the thermal energy created by the ion beam to be transferred to the disk thereby keeping the total temperature rise of the wafers during implantation less than about 100° C. Beam 102 is generated by a source (not shown) and passes through vacuum gate valve 148, cylinder 130, circular hole 170 in plate 126, and slot 172 in slide plate 128, and into chamber 106. Electron source 154 provides a shower of electrons to neutralize the charge of the ions being deposited on the wafers.

Figure 5:
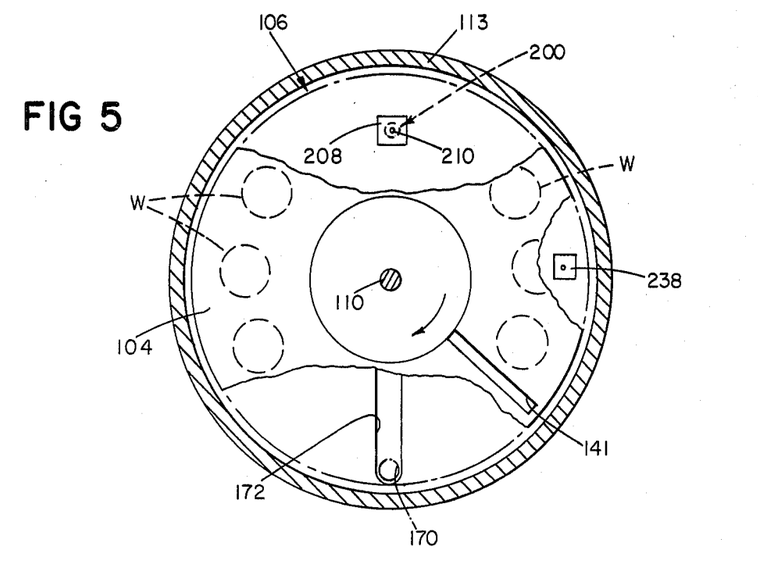
FIG. 5 is a partially broken away, diagrammatic elevation of the rotating disk showing portions of the apparatus behind it.

Referring to FIG. 5, optical detector 238 is shown mounted in wall 113. A light source (not shown) is mounted in cover wall 109 at a facing location.

Figure 6:
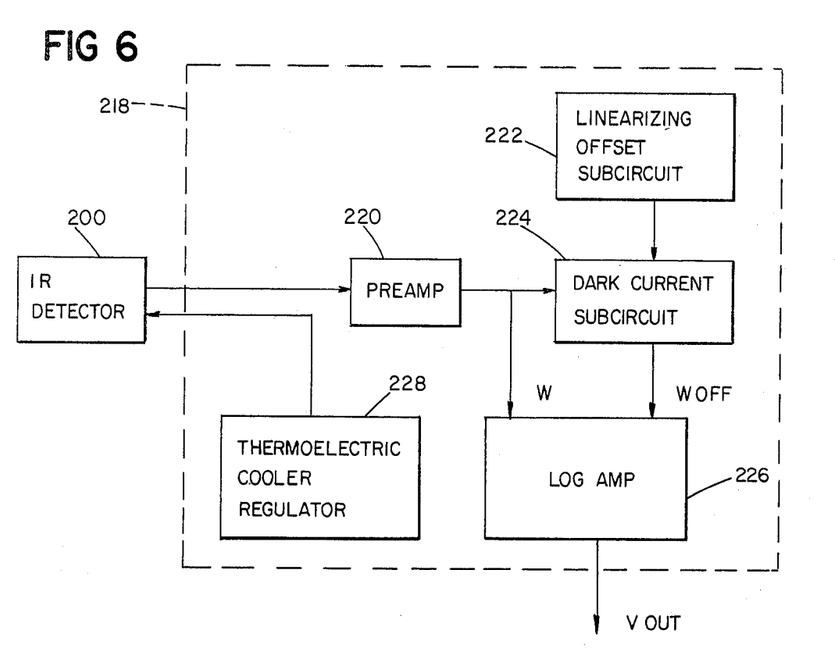
FIG. 6 is a block diagram of an infrared detection circuit connected to an infrared detector.

In FIGS. 6-9, the linearizing circuitry for infrared detector 200, and the circuitry for the alarm, identification, and process control are shown. Referring to FIG. 6, detector 200, whose output is related to power radiated by a black body (i.e., a wafer workpiece $W_S$, reference wafer 2, 12, or a portion of disk 104) is connected to IR circuit 218, whose output, $V_{out}$, is proportional to the temperature of the object whose radiation is sensed by detector 200. Circuit 218 includes preamp 220, (whose output is W), linearizing offset subcircuit 222, dark current subcircuit 224, (whose output is $W_{off}$), log amplifier 226, and thermoelectric cooler regulator 228 for detector 200.

Figure 7:
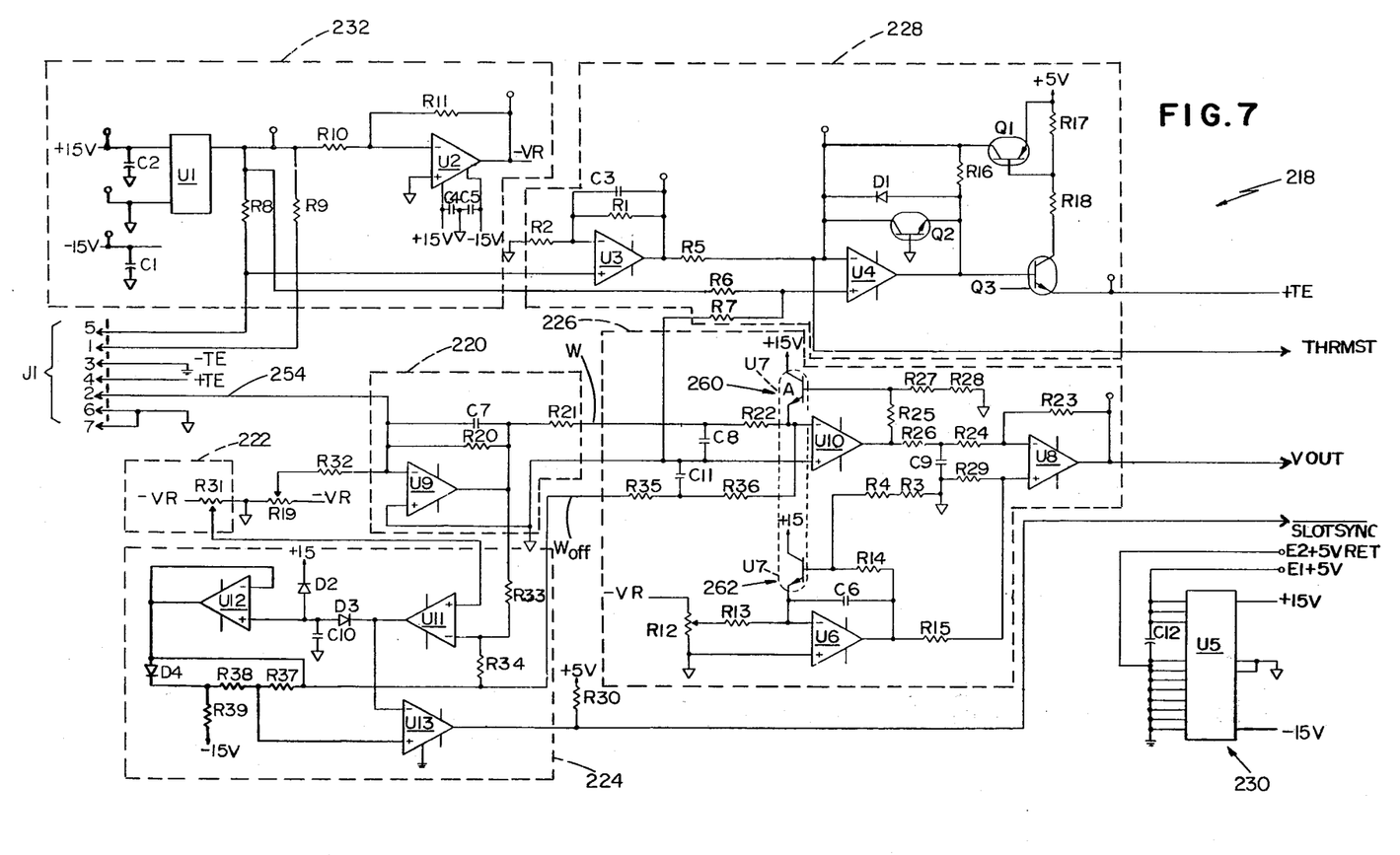
FIG. 7 is an electric schematic for said detection circuit.

Referring to FIG. 7, IR circuit 218 is powered by power supply 230 and reference voltage supply 232, and has lines generally designated J1 for connection to detector 200.

The specific components shown on FIG. 7 can probably best be described by their operation, described in detail below in the operation section. The components are as follows:

| Component | |
|---|---|
| R1 | 49.9 K ohms, 1% |
| R2 | 1 K ohms, 1% |
| R3 | 681 ohms |
| R4, R9, R27, R37 | 1 K ohms |
| R5 | 510 ohms |
| R6 | 7.5 K ohms, 1% |
| R7 | 2.49 K ohms, 1% |
| R8, R16 | 5.6 M ohms |
| R10, R11, R13, R15, R33, R34 | 10 K ohms, 1% |
| R12 | 20 K ohms |
| R14 | 9.09 K ohms, 1% |
| R17 | 0.33 ohm, 2.5W |
| R18 | 1 ohm, 2.5W |
| R19, R31, R38, R39 | 10 K ohms |
| R20 | 10 M ohms, 1% |
| R21 | 100 ohms |
| R22, R35, R36 | 4.99 K ohms |
| R23, R24, R26, R29 | 49.9 K ohms, 1% |
| R25 | 9.09 K ohms, 1% |
| R28 | 681 ohms |
| R30 | 3 K ohms |
| R32 | 1 M ohms, 1% |
| C1, C2, C12 | 10μ farads, 35V |
| C3 | 0.01μfarad |
| C4, C5 | 0.1μ farad |
| C6 | 0.001μ farad |
| C7 | 100 p farad, 200V |
| C8, C9, C11 | 0.022μ farad |
| C10 | 1μ farad |
| U1, U2, U3, U4, U5, U6, U8, U9, U10, U11, U12 | LF335A |
| U7 | AD818 |
| U13 | LM311 |
| Q1 | 2N3906 |
| Q2 | 2N2222 |
| Q3 | MJE3055 |
| D1, D2, D3, D4 | IN914 |

Unless otherwise noted, all resistors are ¼ W, ±5%, and all capacitor values are at 50 V.

Figure 8:
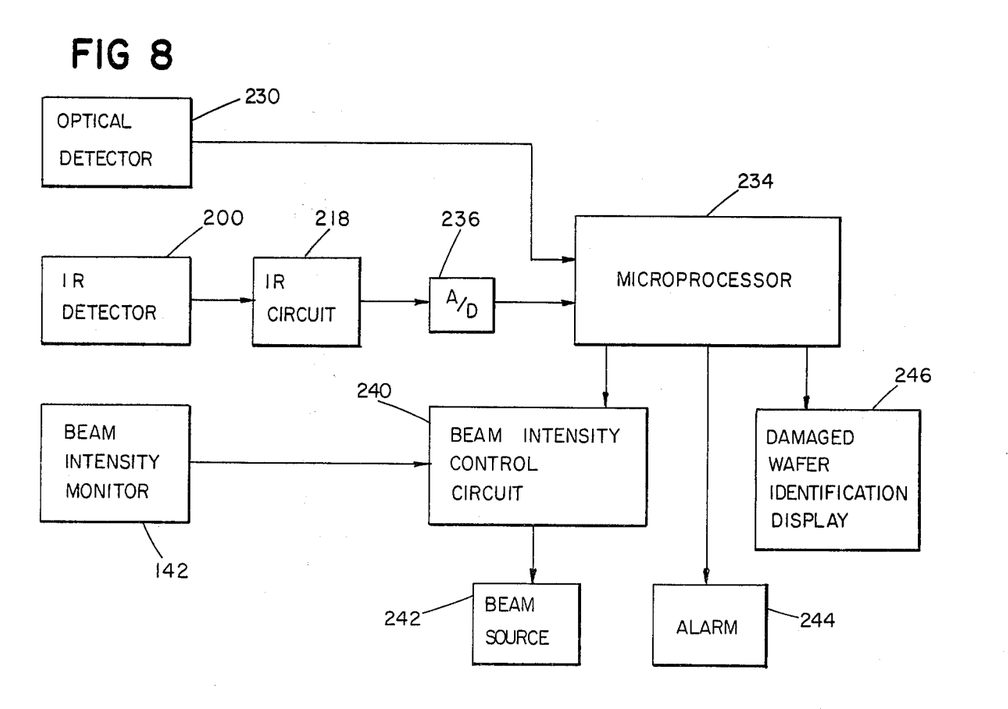
FIG. 8 is a block diagram showing the infrared detector and detection circuit connected to a microprocessor and a number of response circuits.

Referring to FIG. 8, IR detector 200 and IR circuit 218 are shown connected to microprocessor 234 via analog to digital converter 236. Optical detector 238 provides signals to microprocessor 234 indicating that slot 141 is passing it, and this information is used to identify the wafer or portion of spinning disk 104 located in front of IR detector 200 at a given time. Microprocessor 236 is shown providing outputs to the beam intensity control circuit 240 (which receives another input from beam intensity monitor 142 and provides an output to beam source 242), alarm 244, and a damaged wafer identification visual display unit 246.

Figure 9:
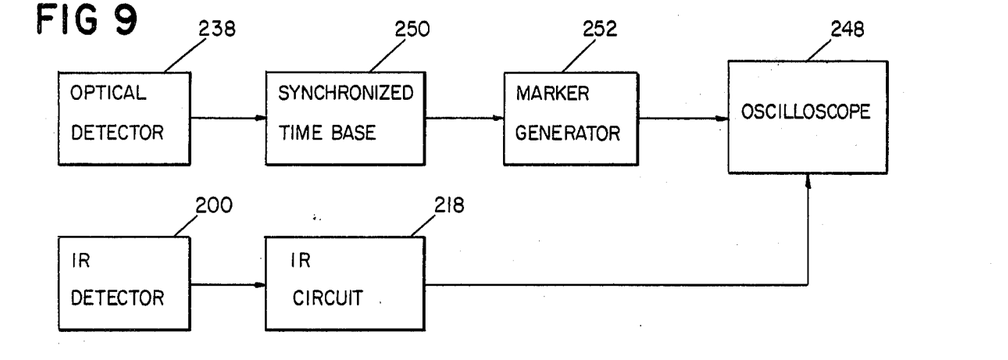
FIG. 9 is a block diagram showing the infrared detector and detection circuit connected to an oscilloscope.

Referring to FIG. 9, IR detector 200 and IR circuit 218 are shown connected to oscilloscope 248, which also receives input from optical detector 238 via synchronized time base 250 and marker generator 252 to identify the wafers the visually displayed data correspond to.

Operation

In operation of the preferred embodiment, the disk chamber is opened to exchange wafers by closing vacuum gate valve 148 to seal off the evacuated ion beam generator, venting the chamber to atmospheric pressure, and opening the chamber.

Figure 1:
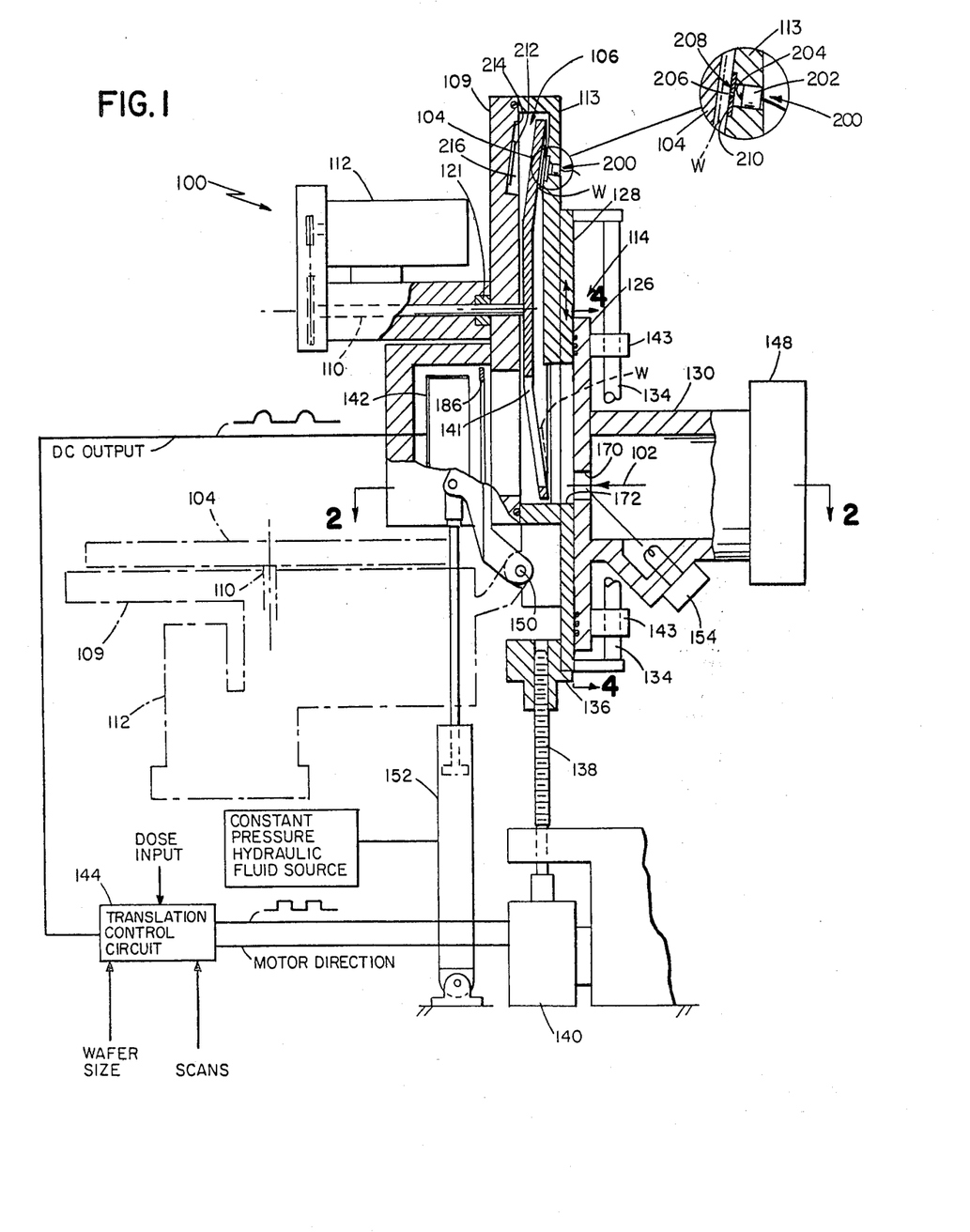
FIG. 1 is a somewhat diagrammatic, partially-sectional elevation of the preferred embodiment of the invention in which wafers are supported on a rotating disk.

Cover wall 109 is rotated 90° by cylinders 152 to the position shown in phantom lines in FIG. 1, and a new disk with new wafers is substituted for the existing one. The cover is then restored to its normal closed position, chamber 106 is evacuated, and gate valve 148 is opened to connect the high-vacuum pumping system of the beam generator (not shown). At this time the rotary motion of the disk is initiated, and DC servo-system 112 is used to bring the rotary velocity of the disk up to the fixed and constant operating velocity required for implantation. The operator selects the desired ion dosage, the wafer size, and the required number of scans, and gives a start signal to translation control circuit 144 to initiate lateral motion of chamber 106 and disk 104. Once the implantation is started, disk 104, and chamber cover 109, wall 113, and DC servo-system 112 are vertically moved in the control direction, the prescribed number of scans, and at a velocity consistent with the measured beam intensity and the required dosage. During this scanning motion the cylinders 152, previously used to close cover wall 109, are furnished with hydraulic fluid by a constant pressure source and bear the weight of the disk-chamber assembly throughout its range of vertical travel.

As disk 104 rotates, different wafers $W_s$ pass aperture 170 and are implanted with ions, thereby causing the generation of heat within the wafers. If this heat is not effectively drained by aluminum disk 104, the temperature could rise to a level at which deleterious diffusion effects or photoresist destruction can occur. IR detector 200 continuously measures the black body radiation of wafers W and portions of disk 104 as they pass it, and of reference wafer 212 when slot 141 of disk 104 provides an uninterrupted path between wafer 212 and detector 200. Reference wafer 212 is used to provide a base line reference, as described below, and has the same emissivity as wafers $W_s$, thereby allowing for correction of this parameter. The power sensed by detector 200 is converted to useful signals to enable controlling of the implantation process to avoid overheating damage, or to identify damaged wafers $W_s$ by the systems described in FIGS. 6–9.

Referring to FIGS. 6 and 7, circuit 218 corrects for dark current (i.e., the current from the detector when radiation is not impinging the wafer or disk, i.e., when the wafer or disk are at room temperature) and the fact that there is not a complete matching of the radiant energy spectrum and the spectrum detected by detector 200 by approximating with the following formula:

$$V_{out} = K \log x \times \frac{W - W_{off}}{W_{ref}}$$

Where:
x is a suitably chosen base for the logarithm,
K is a constant,
W is the power detected by detector 200,
$W_{off}$ is a linearizing offset correcting for dark current and mismatching of spectrums, and
$W_{ref}$ is an arbitrary reference to adjust the output scale.

The output from detector 200 on line 254 is amplified by preamp 220 and converted to a convenient voltage W proportional to the power from detector 200. Preamp 220 also has associated with it potentiometer R19, which is adjusted when the device is installed, to provide an offset for initial dark current.

The output from amplifier U9 is proportional to the energy sensed by IR detector 200, and it is compared by amplifier U11 in subcircuit 224 with a room temperature energy level set by potentiometer R31 and stored in capacitor C10. Whenever the level from preamp 220 is larger, diode D-3 allows the peak value to be stored in capacitor C10. The output of amplifier U12 is equal to the voltage stored in C10. U13 provides an output when the negative peak is reached indicating that slot 141 is in front of detector 200. Voltages W and $W_{off}$ are fed to log amplifier 226, in which $W_{off}$ is subtracted from W prior to being converted to logarithimic form by amplifier U10 and transistor 260 in its feedback loop. The desired output scale is adjusted by adjusting potentiometer R12, whose voltage $W_{ref}$ is similarly converted to a logarithm by amplifier U6 and transistor 262, and log $W_{ref}$ is subtracted from log $(W - W_{off})$ at amplifier U8. The output of amplifier U8 is $V_{out}$, approximately proportional to the temperature.

Thermoelectric cooler regulator subcircuit 228 drives the thermoelectric cooler for IR detector 200, maintaining it at $-30°$ C. On the back of the detector, there is a temperature sensing element (not shown) providing a signal on line 5 of J1, which signal is amplified by U3. The output from U3 is compared by amplifier U4 to a fixed level anticipated when the IR detector is at $-30°$ C. If this output varies from the fixed level, an output will be provided to power transistor Q3, which will supply current to the thermoelectric cooler via connection TE until $-30°$ C. is reached; then the current is cut off or regulated to maintain that temperature. Transistors Q1 and Q2 prevent excessive current from being sent to the thermoelectric cooler in case of malfunction. Connection THRMSET provides an amplified signal indicating the temperature of the thermoelectric cooler thermistor.

Figure 10:
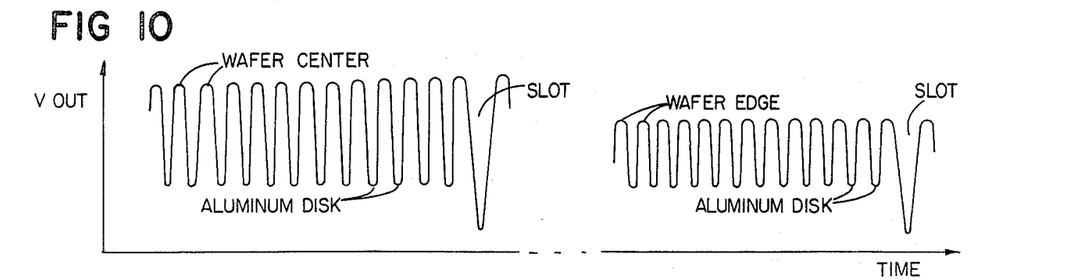
FIG. 10 is a diagram showing a typical output of the detection circuit as a function of time.

FIG. 10 shows the varying of $V_{out}$ with time. $V_{out}$ increases when a wafer passes detector 200, and decreases when a portion of aluminum disk 104 (at a lower temperature) passes. $V_{out}$ is at a minimum (a minimum or negative peak) when slot 141 passes detector 200, and the wafer peak values are higher when beam 102 is impinging the center of the wafers than when it is impinging the edges of the wafers, because each wafer W receives more energy in the former case.

When $V_{out}$ feeds microprocessor 236 (FIG. 8) the temperature information can be used with spinning disk position signals from optical detector 238 in a number of process controls. For example, if the temperature of a wafer W exceeds a level at which damage occurs, it can be identified on display 246 and discarded prior to costly post-implantation processing. The actual temperature need not be determined; one can determine a level of radiation at which damage occurs, and use this radiation level directly as the basis for identifying damaged wafers. If such a temperature or radiation limit is exceeded or being approached, alarm 244 can be activated to allow the operator to stop the implantation to determine why the proper cooling is not occurring. Finally, if the limit is being approached, steps can be taken by microprocessor 234 to slow down the heat absorption, by decreasing the intensity of beam 102 with intensity control circuit 240, which receives another input from beam intensity monitor 142 and controls beam source 242.

When $V_{out}$ feeds oscilloscope 248, the peaks and valleys of FIG. 10 are displayed on it along with markers provided by marker generator 252 indicating which peaks are associated with which wafers W.

The lateral velocity is limited so that it does not exceed a maximum velocity of 1.0 per second. This means that the lateral distance between two successive passes of the beam will not exceed approximately 2 mm. As the beam 102 is typically on the order of 2 cm in diameter, this constraint on lateral velocity ensures excellent overlapping characteristics of the beam during the implantation process. In the described embodiment, the disk has a single sampling slot, and, as the disk is rotating at approximately 800 rpm, the period between successive beam samples is about 75 m sec. This sampling rate is sufficient to achieve an overall dosage accuracy and uniformity of better than 1%.

Typically the scanning process may take anywhere from 1 to 60 minutes. On completion of the traversal of the disk, and after it is determined that the disk has returned to the initiation position with the beam located at the outer edge of the disk, the implantation is complete, and the sequence for closing the gate valve 148, venting the chamber 106, and reloading the disk spindle is initiated again.

In other embodiments of the broader aspects of the invention, other mechanical devices can be used. For example, in another fixed beam embodiment there might be used a rotating belt with an orthogonal transverse drive, the IR detector being mounted to move transversely with the belt.

What is claimed is:

1. In apparatus for treating workpieces by directing a beam at the workpieces, with resultant heating of said workpieces, said apparatus including a moving support element for repeatedly carrying a multiplicity of workpieces successively past said beam in a scanning direction, means for providing translation of said support element relative to said beam in a control direction generally orthogonal to said scanning direction, said means for providing translation including a structure that moves in said control direction with said support element but not in said scanning direction, the improvement comprising an infrared detector mounted on said structure in position to receive black body radiation individually from said multiplicity of workpieces and intervening portions of said support element as the workpieces pass said detector in their movements in said scanning direction, registry means to correlate the position of said moving support element passing said detector with the radiation being sensed by said infrared detector to correlate black body radiation signals with respective workpieces, and means to correct black body radiation measurements of said workpieces for noise resulting from dark current variation, whereby an indication of the temperatures of said individual workpieces can be obtained as said workpiece movements and beam treatment occur.

2. In apparatus for treating a workpiece by directing a beam at the workpiece, with resultant heating of said workpiece, said apparatus including a moving support element for carrying said workpiece past said beam in a scanning direction, means for providing translation of said support element relative to said beam in a control direction generally orthogonal to said scanning direction, said means for providing translation including a structure that moves in said control direction with said support element but not in said scanning direction, the improvement comprising an infrared detector mounted on said structure, in position to receive black body radiation from said workpiece when said workpiece passes said detector in its movement in said scanning direction, and wherein said moving support element has an opening exposing said IR detector to an object at a known temperature on the other side of said support element when said opening passes said detector whereby said detector can measure black body radiation of said object, and further comprising means operative in response to said periodic measurements to correct black body radiation measurements of said workpiece for noise resulting from dark current variation, whereby an indication of the temperature of said workpiece can be obtained as said workpiece movement and beam treatment occur.

3. In apparatus for treating a workpiece by directing a beam at the workpiece, with resultant heating of said workpiece, said apparatus including a moving support element for carrying said workpiece past said beam in a scanning direction, means for providing relative translation between said support element and said beam in a control direction generally orthogonal to said scanning direction, measuring means for measuring the intensity of said beam, said support element having a slot extending generally along said control direction, said beam measuring means comprising means positioned behind said support element for measuring the intensity of said beam travelling through said slot, and translation control means comprising means for varying the speed of translation in said control direction in dependent response to said measured intensity of said beam travelling through said slot, the improvement comprising an infrared detector mounted for the same relative translation as said support element in said control direction but not moving with said support element in said scanning direction, said detector being adapted to measure the black body radiation of said workpiece when said workpiece passes said detector in its movement in said scanning direction and to measure the black body radiation of an object at a known temperature on the other side of said support element when said slot passes said detector, and means operative in response to said periodic measurements to correct black body radiation measurements of said workpiece for noise resulting from dark current variation, whereby an indication of the temperature of said workpiece can be obtained as said workpiece movement and beam treatment occur.

4. The apparatus of claim 1, 2 or 3 wherein said apparatus is an ion implanter, and said moving support element is a spinning disk.

5. The apparatus of claim 2 or 3 wherein said object at known temperature is a workpiece similar to the workpiece receiving said beam and mounted so as to not be scanned by said beam.

6. The apparatus of claim 1 wherein said apparatus is an ion implanter, said moving support element is a spinning disk adapted to carry workpieces, and said registry means comprises optical detector means to sense the positions of said workpieces as they move in said scanning direction.

7. The apparatus of claim 1, or claim 2 or 3 where said support carries a multiplicity of workpieces, further comprising electronic control means receiving signals from said means to correct black body radiation measurements and signals from registry means that correlate the radiation being sensed with respective workpieces, said electronic control means being adapted to provide therefrom control output signals identifying a workpiece that has passed a predetermined temperature.

8. The apparatus of claim 7 further comprising an alarm receiving signals from said electronic control means, said alarm sounding when the temperature of any of said workpieces exceeds a predetermined level.

9. The apparatus of claim 1, 2 or 3 further comprising electronic control means receiving signals from said means to correct black body radiation measurements to provide intensity change signals indicating whether the beam intensity should be varied to maintain the temperature of a workpiece below a predetermined level,
a beam intensity detector measuring the intensity of said beam impinging said workpiece, and
an intensity control circuit for a source of said beam, said intensity control circuit receiving said intensity change signals and signals from said beam intensity detector and driving said source.

10. The apparatus of claim 1, 2 or 3 further comprising an oscilloscope of visually display signals from said means to correct black body radiation measurements.

11. The apparatus of claim 1, 2 or 3 wherein said moving support element is a spinning disk rotating about an axis, said workpiece is mounted on said disk with its beam-receiving face at an acute angle to said axis, and said infrared detector is mounted on an axis perpendicular to said beam-receiving face of said workpiece.

12. The apparatus of claim 1, 2, or 3 wherein said moving support is a spinning disk, a number of said workpieces are supported by said disk, and an optical detector is used to provide signals indicating workpiece position to an electronic control means that is adapted to also receive signals from said means to correct black body radiation and to provide output signals indicating the temperatures of said workpieces.

13. The apparatus of claim 1, 2, or 3 wherein said apparatus is an ion implanter, said moving support element is a spinning disk mounted for rotation in a housing, said means for providing translation translates said housing in said control direction, and said structure is a wall of said housing.

14. In apparatus for treating workpieces by directing a beam at the workpieces, with resultant heating of said workpieces, said apparatus including a moving support element for repeatedly carrying a multiplicity of workpieces successively past said beam in a scanning direction, means for providing translation of said support element relative to said beam in a control direction generally orthogonal to said scanning direction, the improvement comprising
an infrared detector mounted to sequentially, periodically receive black body radiation from said workpieces and from a constant temperature body,
said detector providing an output proportional to the power of black body radiation sensed by it,
means to convert said output to a voltage, W, proportional to said power,
means to provide an offset voltage, $W_{off}$, dependent upon the black body radiation of said constant temperature body,
means to provide an output voltage, $V_{out}$, proportional to the temperature of said workpiece by producing a signal with a voltage proportional to the logarithm of W minus $W_{off}$, and
registry means to correlate the position of said moving support element passing said detector with the radiation being sensed by said infrared detector to correlate successive black body radiation signals with respective workpieces.

15. The apparatus of claim 1, 2 or 3 further comprising a thermoelectric cooler mounted in said structure to maintain the temperature of said infrared detector at a desired level.

16. In apparatus for treating workpieces by directing an ion beam at the workpieces, with resultant heating of said workpieces, said apparatus including a spinning disk support element for repeatedly carrying a multiplicity of workpieces successively past said beam in a scanning direction, means for providing translation of said spinning disk support element relative to said beam in a control direction generally orthogonal to said scanning direction, said means for providing translation including a structure that moves in said control direction with said support element but not in said scanning direction, the improvement comprising
an infrared detector mounted on said structure in position to receive black body radiation individually from said multiplicity of workpieces and intervening portions of said support element as the workpieces pass said detector in their movements in said scanning direction, and
means to correct black body radiation measurements of said workpieces for noise resulting from dark current variation,
whereby an indication of the temperature of said individual workpieces can be obtained as said workpiece movements and beam treatment occur.

17. In a method of treating workpieces by directing a beam at the workpieces, with resultant heating of said workpieces, said method comprising
providing a moving support element,
repeatedly carrying a multiplicity of workpieces on said support element past said beam in a scanning direction,
translating said support element relative to said beam in a control direction generally orthogonal to said scanning direction,
moving a structure in said control direction with said support element but not in said scanning direction, the improvement comprising
providing an infrared detector mounted on said structure,
receiving black body radiation individually from said multiplicity of workpieces and intervening portions of said support element as the workpieces pass said detector in their movements in said scanning direction,
correlating the position of said moving support element passing said detector with the radiation being sensed by said infrared detector to correlate black body radiation signals with respective workpieces,
correcting black body radiation measurements of said workpieces for noise resulting from dark current variation, and
detecting peak infrared amplitudes and determining the location of any workpiece having a peak amplitude exceeding a predetermined limit.

* * * * *

UNITED STATES PATENT AND TRADEMARK OFFICE
CERTIFICATE OF CORRECTION

PATENT NO. : 4,419,584
DATED : December 6, 1983
INVENTOR(S) : Victor M. Benveniste It is certified that error appears in the above-identified patent and that said Letters Patent are hereby corrected as shown below:

Column 2, line 26, "pulse" is changed to --pulses--.

Column 3, line 53, "stationry" is changed to --stationary--.

Column 4, line 52, "off" is changed to --of--.

Column 5, line 12, "apperature" is changed to --aperture--.

Column 5, line 12, "206 is" is changed to --206 in--.

Column 8, line 63, "1.0 per second" is changed to --1.0 inch per second--.

Column 11, line 22, "of visually" is changed to --to visually--.

Signed and Sealed this

Twenty-ninth Day of May 1984

[SEAL]

Attest:

GERALD J. MOSSINGHOFF

Attesting Officer    Commissioner of Patents and Trademarks